United States Patent [19]
Hanrahan et al.

[11] Patent Number: 5,246,803
[45] Date of Patent: Sep. 21, 1993

[54] PATTERNED DICHROIC FILTERS FOR SOLID STATE ELECTRONIC IMAGE SENSORS

[75] Inventors: Michael J. Hanrahan; Anna L. Hrycin; Armin K. Weiss, all of Rochester, N.Y.

[73] Assignee: Eastman Kodak Company, Rochester, N.Y.

[21] Appl. No.: 851,117

[22] Filed: Mar. 16, 1992

Related U.S. Application Data

[63] Continuation of Ser. No. 556,136, Jul. 23, 1990, abandoned.

[51] Int. Cl.[5] .............................................. G03F 9/00
[52] U.S. Cl. .......................................... 430/7; 430/24; 430/27; 250/214.1; 136/257; 313/112; 359/885; 359/887; 359/580; 359/589; 356/350; 427/255.3; 427/248.1; 427/294; 427/314
[58] Field of Search ................... 430/7, 24, 27; 250/211 J; 136/257; 313/112; 359/885, 887, 580, 589; 356/350; 427/255.3, 248.1, 294, 314

[56] References Cited

U.S. PATENT DOCUMENTS

| | | | |
|---|---|---|---|
| 3,873,313 | 3/1975 | Horst et al. | 430/312 |
| 3,996,461 | 12/1976 | Sulzbach et al. | 250/211 J |
| 4,313,648 | 2/1982 | Yano et al. | 350/166 |
| 4,461,532 | 7/1984 | Sato et al. | 350/166 |
| 4,534,620 | 8/1985 | Gale et al. | 350/166 |
| 4,659,178 | 4/1987 | Kyogoku | 350/166 |
| 4,747,666 | 5/1988 | Ishida | 350/166 |
| 4,851,095 | 7/1989 | Scobey et al. | 204/192.12 |
| 4,854,670 | 8/1989 | Mellor | 350/166 |
| 4,865,451 | 9/1989 | Ahonen et al. | 356/350 |
| 4,973,131 | 11/1990 | Carnes | 356/352 |
| 5,002,365 | 3/1991 | DeJager et al. | 350/166 |
| 5,058,997 | 10/1991 | Dickerson et al. | 359/59 |
| 5,120,622 | 6/1992 | Hanrahan | 430/7 |

OTHER PUBLICATIONS

Elliott, D., "Integrated Circuit Fabrication Technology", pp. 27–32, McGraw-Hill Book Co., 1982.
Kramer and Hoffman, Journal of Imaging Technology, vol. 12, pp. 270–279 (Oct. 1986).
Hall et al., "Stripe Filters on Multispecial Linear Arrays," Final Report Contract No. NAS5-25622 For NASA Goddard Space Flight Center, Greenbent, Md. by Westinghous Defense & Elec. Systems Balt. Md. (1981–1982).
Shimoto et al. Surface Science 86, 417–423, 1979.

*Primary Examiner*—Charles L. Bowers, Jr.
*Assistant Examiner*—Thomas R. Neville
*Attorney, Agent, or Firm*—Raymond L. Owens

[57] ABSTRACT

Forming a color filter by vacuum depositing alternating layers of $SiO_2$ and $TiO_2$ at a temperature of less than 150° C.

3 Claims, 1 Drawing Sheet

PATTERNED DICHROIC FILTERS FOR SOLID STATE ELECTRONIC IMAGE SENSORS

This is a continuation of application Ser. No. 556,136, filed Jul. 23, 1990, now abandoned.

CROSS REFERENCE TO RELATED APPLICATION

Reference is made to commonly assigned U.S. patent application Ser. No. 475,587, filed Feb. 5, 1990 and entitled "Lift-Off Process for Patterning Dichroic Filters".

1. Field of the Invention

This invention relates to color filter arrays for solid state electronic image sensor and displays.

2. Background of the Invention

Color filter arrays are employed in combination with image sensors to define color images or in combination with display devices to permit color images to be viewed. Whenever the term image sensor is used, it will be understood to include display devices. A common approach to producing color filter arrays has been to use organic dyes embedded in a layer which has been patterned by various techniques to render the appropriate filter pattern. This approach has two significant disadvantages. The spectral characteristics of the filter are controlled by the absorbance curves of the dye and layer materials. Altering the spectral characteristics, therefore, requires altering the dye or layer material, which can be a difficult and time consuming process. Furthermore, the dyes may be subject to fading with time, especially under harsh environmental operating conditions such as high light levels, etc.

An alternative approach, which overcomes the disadvantages of the organic dye approach, has been to produce color filter arrays from interference filters made up of alternating layers of two dielectric material with different refractive indices. Various combinations of pairs of dielectric materials and deposition and patterning techniques have been used. One particular interference filter which uses a metal and dielectric layer is known as a Fabry-Perot interference filter.

In some sense, there exists a synergistic relationship between the choice of dielectric materials and the lithographic patterning technique employed. Thorium fluoride, zinc sulfide and cryolite are often chosen because these materials exhibit good film properties and adhesion even when deposited at temperatures that are compatible with organic based resist systems. Kramer and Hoffman in the *Journal of Imaging Technology*, Vol. 12, Page 270-279 (Oct. 1986) reported on the production of a linear color filter set on a glass substrate. Cryolite and zinc sulfide were chosen as the low index and high index materials, respectively. These materials were selected so that the substrate temperatures could be kept low to prevent damage to the photoresist material. Sulfur from the zinc sulfide, however, has the potential of poisoning an electronic device. This is especially true when filters are fabricated directly onto a device. The filters were based upon an all dielectric Fabry-Perot broad bandpass design. Thirty-seven to forty-one alternating layers of material were deposited. To prevent stress cracking in the final filter, the use of several air anneal steps were required. The process required 2-3 days of preparation time for each filter and resulted in final filter thicknesses of 4.2 $\mu$m. Problems with chipping of the filter edge indicates that the resist cross-section may have been trapezoidal rather than the more desirable reentry profile typically used in lift-off processes and suggest that a "psuedo-lift-off" process was employed. Others have used this technique to pattern brittle, dielectric materials. Hall, et al in "Stripe Filters on Multispectral Linear Arrays", Final Report Contract No. NAS5-25622 for NASA Goddard Space Flight Center, Greenbelt, Md. by Westinghouse Defense and Electronics Systems Center, Baltimore, Md. (1981-1982) disclosed the production of stripe filters on glass substrates for use with multispectral linear arrays. In their work, the filters were interference type made up of zinc sulfide and thorium fluoride with an intermediate silver spacer layer. Thorium fluoride was chosen because of its' adhesion properties to silicon dioxide. However, it is also known that thorium fluoride can give higher than desirable dark current in CCD sensors because of its low level radioactivity.

The refractory oxides (i.e., silicon dioxide and titanium dioxide) represent good choices based on chemical compatibility with electronic devices and processing. However, these materials are usually deposited at significantly greater temperatures than desirable for a final manufacturing step. Excessive heating may damage the metallizations used for electrical conduction in the device. Therefore, the approach has been to fabricate filters from these materials onto glass substrates and attach the filters to devices using adhesives. Pattern transfer techniques may also be required making the process complicated and cumbersome.

Some approaches have employed lift-off techniques to provide patterned filters. The deposition of titanium dioxide and silicon dioxide stacks onto glass by sputtering techniques has been reported by Shimomoto, et al in Surface Science 86, 417-423, 1979. For their applications, a subsequent electrode deposition step was conducted at 500° C. The filters were sputtered to control the films and ensure that the filters would survive the electrode deposition step without any change in the spectral characteristics. A lift-off technique was required which could tolerate the temperatures encountered. This was accomplished using a double metal lift-off process employing aluminum and chrome. This process also involved patterning with an organic based resist system followed by transfer of the pattern into the metals. Cyan, yellow and magenta strip filters were produced with thicknesses of 1.2, 0.67 and 1.85 $\mu$m, respectively.

Some processes for patterning filters are based upon etching away unwanted areas. Green and cyan dichroic filters have been made on glass using titanium dioxide and silicon dioxide dielectric stacks. See U.S. Pat. No. 4,534,620. Using positive-working photoresist and dry etching techniques, areas of the yellow and cyan stack are removed to give a cyan, green and white filter. It should be noted that this particular approach is limited in that the spectral characteristics of the green filter is determined by the cyan filter. Therefore, independent variation of the spectral characteristics of the two filters is not possible.

Lower temperature deposition techniques for these materials are not known. However, several significant advantages could be realized by such a process. Filters could be fabricated directly upon electronic devices and therefore eliminate the need for a hybrid packaging process. In U.S. Pat. No. 3,996,461 Sulzbach, et al has shown that deposition of silicon dioxide and titanium dioxide interference filters directly onto silicon photosensors is possible. In this approach the filters were not patterned, therefore, it is not apparent whether the process is compatible with organic photoresist lift-off techniques.

SUMMARY OF THE INVENTION

This invention pertains to the production of color filter arrays by depositing alternating layers of silicon dioxide and titanium dioxide dielectric materials onto either a glass substrate or directly onto a solid state image sensor. We have discovered that $SiO_2$ and $TiO_2$ can be effectively vacuum deposited at low temperatures to form color filters. The spectral characteristics can be controlled to give virtually any desired effect by control of the number and thicknesses of the layers. The patterning and deposition process may be repeated as many times as desired. In this fashion, a number of filters each having independently variable spectral and spatial characteristics can be produced on the same substrate.

An advantage of this process is the deposition of refractory titanium dioxide and silicon dioxide at low temperatures. Quite surprisingly, these deposited layers are durable with controllable optical properties and chemical compatibility with electronic solid state devices, thereby overcoming many of the disadvantages and processing complexities mentioned above.

DETAILED DESCRIPTION OF THE PREFERRED EMBODIMENT

Any combination of filters can be made on any suitable substrate from stacks of alternating layers of titanium dioxide and silicon dioxide. It is most desirable, however, to produce red, green and blue filters directly onto solids state imaging devices. Furthermore, these filters are characterized by greater than 80% and less than 5% transmittance in the on-band and off-band regions of the spectra, respectively. On-band and off-band regions refer to the portion of the electromagnetic spectrum where it is desirable to transmit and reflect incident radiation, respectively. For example, a blue filter may have an on-band region of 400–500 nm and an off-band region of 500–700 nm.

The exact order, thicknesses and number of layers of silicon dioxide and titanium dioxide are determined by the spectral requirements of the particular application.

Figure 1A:
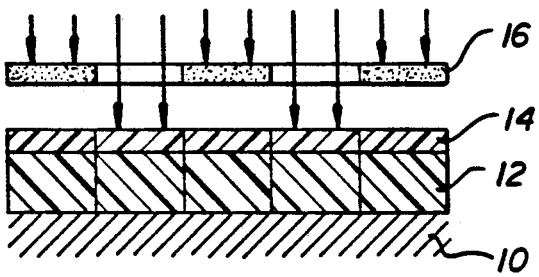
FIGS. 1a-e show various steps in practicing a method according to this invention.

FIGS. 1(a)–(e) are schematics which show the deposition of a dielectric color filter stack and final lift-off step. As shown in FIG. 1(a), a double-layer photoresist system, made up of a second photoresist layer 14 coated onto a first photoresist layer 12 deposited on a substrate 10, is provided as set forth in U.S. Ser. No. 475,587, the disclosure of which is incorporated by reference herein.

Figure 1B:
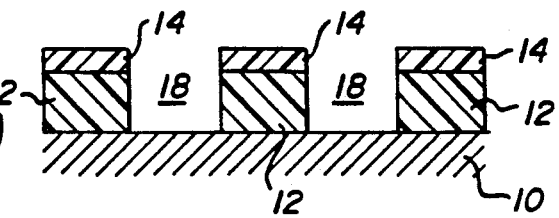
Figure 1C:
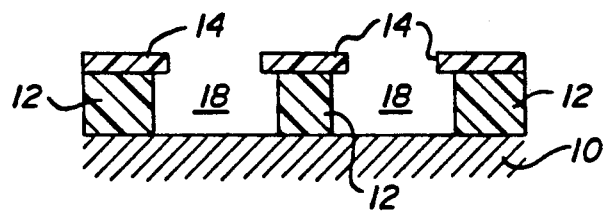
Figure 1D:
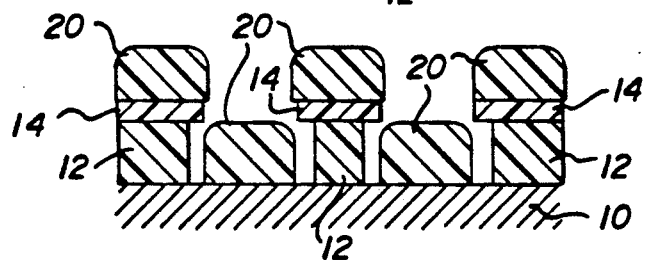
Figure 1E:
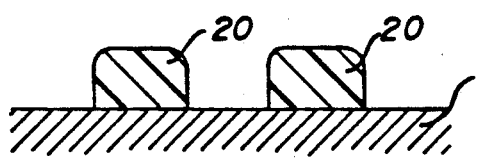

After a patternwise exposure of FIG. 1(a) in which a mask 16 having suitable arranged patterns of clear and opaque areas to produce the desired pattern in the photoresist layers, the exposed areas in both resist layers are developed rapidly to produce nearly vertical sidewalls in both layers (see FIG. 1(b)). Extended development provides openings 18 and results in removing more of the lower layer than the upper layer and produces an overhang (FIG. 1(c)) in the openings 18. Deposition of the alternating layers of $SiO_2$ and $TiO_2$ as shown in FIG. 1(d) results in a discontinuity between the material deposited on the substrate and on the resist. The deposition is performed in an evaporator equipped with two crucibles; one containing silicon dioxide, the other containing titanium dioxide. The process is performed at starting pressures of $5 \times 10^{-6}$ torr and oxygen is delivered into the vacuum system during the deposition process so that the pressure is maintained less than $1 \times 10^{-4}$ torr. Alternating depositions of each material is accomplished by alternating heating of each crucible. The substrates 10 are held in a holder which rotates during the deposition to improve coating uniformity and are heated to 150° C. by radiant quartz heaters. This discontinuity allows a solvent for the resist materials to dissolve away both resists, causing the dielectric stack deposited on the resist to float away in the solvent, i.e. "lift-off" (see FIG. 1(e)). The solvent used may be the same as that used to produce the developed patterns in FIG. 1(c). However, other solvents which are known to dissolve photoresist can be used.

EXAMPLE 1

Four inch round glass wafers were coated with KTI-820 100 cst photoresist by spin coating on a Headway spinner at 3,500 rpm for 60 seconds. The coatings were baked in a convection oven at 95° C. for 30 minutes. The coatings were exposed through a striped pattern mask using a Tamarack high-pressure mercury vapor exposing unit (intensity of 11.2 mw/cm2) for 15 sec. The exposed coatings were developed with KTI-934 developer diluted to 5 parts of developer to 7 parts of water to produce the striped pattern in the coating. The patternwise coated substrates were placed in a Balzer vacuum coater. While heating the substrates to 150° C. with quartz heaters, alternating layers of titanium dioxide and silicon dioxide were deposited onto the substrates. The first layer deposited was titanium dioxide and thirty-four layers in total were deposited with the average thickness of the titanium dioxide and silicon dioxide being 700 and 1100 Å, respectively. After removal from the vacuum coater, the substrates were immersed in acetone and the resist/dielectric stack removed from the unwanted areas. A series of blue stripe filters ranging in width from several millimeters to 80 μm were produced exhibiting good fidelity to the original mask.

EXAMPLE 2

Four inch round wafers were cleaned in Chromerge ® and rinsed with deionized water. The wafers were dried at 200° C. for 30 minutes. The wafers were treated with KTI HMOS (an adhesion promoter) by spin coating at 3,500 rpm for 30 seconds. A resist coating of KTI-820 (100 cst) was applied by spin coating at 3,500 rpm for 60 seconds. The coating was baked at 95° C. for 30 minutes. The coating was exposed at 10 LI on a Canon PLA-501 Mask Aligner Contact Exposing Tool in soft contact. A striped pattern mask was used during the exposure step. The coating was developed with the same developer as used in Example 1 for 2.5 minutes followed by a 30 seconds deionized water rinse. The wafer was spun dry at 2,000 rpm for 30 seconds followed by a post-bake at 95° C. for 20 minutes. The coating was given a blanket exposure of 20 LI. The substrates were placed in the vacuum coater described previously and the $TiO_2/SiO_2$ stack deposited so as to produce a red filter.

After deposition, the resist/filter was removed from the unwanted regions by soaking in acetone followed by ultrasonic agitation. The wafer was then subject to the above described process a second time. The exceptions being that a different mask was used during exposure and the TiO$_2$/SiO$_2$ thicknesses were adjusted so that a green filter would result from the second deposition. After removal of the resist, a striped pattern of a red filter and a green filter was produced. Both filters were 95 μm wide and were separated by 32 μm.

EXAMPLE 3

Using the same patterning and coating procedures described in the previous example, red, green and blue filters made from the TiO$_2$/SiO$_2$ dielectric stacks were manufactured on a silicon wafer composed of linear sensors.

The invention has been described in detail with particular reference to certain preferred embodiments thereof, but it will be understood that variations and modifications can be effected within the spirit and scope of the invention.

We claim:

1. In a method of providing a color filter on an image sensor comprising the steps of:
   (a) depositing a layer of a photoresist on a substrate and patterning the photoresist to provide openings to the substrate;
   (b) depositing a predetermined number of alternating layers of SiO$_2$ and TiO$_2$, respectively, upon the photoresist and the substrate via the openings by vacuum evaporation techniques while maintaining the substrate at a temperature less than 150 degrees Centigrade, the alternating layers having a thickness selected to provide a desired color filter; and
   (c) lifting off the color filter on the photoresist by dissolving the photoresist layer.

2. The method of claim 1 wherein the substrate is glass.

3. The method of claim 2 further including attaching the color filter to an image sensor.

* * * * *